United States Patent [19]
Fukuda et al.

[11] Patent Number: 5,497,029
[45] Date of Patent: Mar. 5, 1996

[54] TIN-INDIUM ANTIMONIDE INFRARED DETECTOR

[75] Inventors: Katsuyoshi Fukuda, Yokosuka; Fumio Nakata, Urayasu; Keitaro Shigenaka, Hachioji; Keijiro Hirahara, Tokyo, all of Japan

[73] Assignee: Kabushiki Kaisha Toshiba, Kanagawa, Japan

[21] Appl. No.: 305,516

[22] Filed: Sep. 13, 1994

[30] Foreign Application Priority Data

Sep. 14, 1993 [JP] Japan ................................ 5-229165

[51] Int. Cl.$^6$ .............................................. H01L 31/0304
[52] U.S. Cl. .......................... 257/613; 257/615; 257/184; 257/189; 257/441
[58] Field of Search ................................ 257/613, 615, 257/184, 188, 189, 441

[56] References Cited

U.S. PATENT DOCUMENTS 4,238,232  12/1980  Minomura .............................. 75/134 T

FOREIGN PATENT DOCUMENTS 3-116822  5/1991  Japan .

OTHER PUBLICATIONS

"Effect of Tin Doping on InSb Thin Films", M. Oszwaldowski et al., Thin Solid Films, 172:71–80 (1989).

"Improving the Performance of InAs$_{1-x}$Sb$_x$/InSb Infrared Detectors Grown By Metalorganic Chemical Vapor Deposition", R. M. Biefeld et al., Journal of Crystal Growth, 107:836–839 (1991).

*Primary Examiner*—Robert P. Limanek
*Assistant Examiner*—David B. Hardy
*Attorney, Agent, or Firm*—Finnegan, Henderson, Farabow, Garrett & Dunner

[57] ABSTRACT

A compound semiconductor device suitable for an infrared ray detector comprises a substrate composed of indium antimonide (InSb), a first conductive layer deposited on the substrate and composed of tin-indium antimonide represented by the formula Sn$_x$(InSb)$_{1-x}$, where $0.05 \leq x \leq 0.3$, a second conductive layer that is a semiconductor region (active region) formed on the first conductive layer, and electrode provided on the second conductive layer, and a surface protective film formed on the first conductive layer except for the electrode portions.

8 Claims, 4 Drawing Sheets

TIN-INDIUM ANTIMONIDE INFRARED DETECTOR

BACKGROUND OF THE INVENTION

1. Field of the Invention

The present invention relates to a compound semiconductor and a device thereof suitable for an infrared ray detector and a fabrication method thereof.

2. Description of the Related Art

A compound semiconductor device having a narrow energy gap is used for an infrared ray detector using, for example, indium antimonide (InSb). However, since the energy gap of indium antimonide is 0.17 eV, which is constant, the wavelengths of infrared rays that can be detected are restricted to approximately 5 μm or less. As another compound semiconductor, mercury cadmium telluride ($Cd_xHg_{1-x}Te$) is known. In the mercury cadmium telluride semiconductor, when x of $Cd_xHg_{1-x}Te$ is varied, the energy gap can be changed in the range from 0 to 1.6 eV. In particular, when the composition ratio x of cadmium is around 0.2, the energy gap becomes 0.1 eV. Thus, a compound semiconductor having an infrared detecting function of around 10 μm band can be obtained.

However, the mercury cadmium telluride ($Cd_xHg_{1-x}Te$) is composed of Hg and Cd, which are elements of group II, and Te, which is an element of group VI. In addition, the chemical bonding strength among these elements is weak. Moreover, mercury is thermally unstable. Thus, with these elements, it is difficult to fabricate homogeneous semiconductors with high reproducibility. Consequently, such a compound semiconductor device is not practically used. In reality, in a $Cd_xHg_{1-x}Te$ layer that is epitaxially grown, defects are present on the order of $10^5$ to $10^8$ cm$^{-2}$ as EPD (Etch Pit Density) and fixed electric charges in a protective film are distributed in the range of $\pm 10^{12}$ cm$^{-2}$. Thus, the characteristics of the compound semiconductor tend to vary with temperature change. In addition, mercury of the composition elements has a problem in environmental conservation. Moreover, mercury should be handled and controlled with special care. Although the compound semiconductor device is attractive in characteristics, the utilization thereof is difficult.

SUMMARY OF THE INVENTION

The present invention is made to solve the above described problem. An object of the present invention is to provide a compound semiconductor and a device with large bonding strength of composition elements, stable crystal growth, and a narrow energy gap for infrared ray detecting function of 10 μm band.

A compound semiconductor of the present invention is a compound represented by the general formula of $Sn_x(InSb)_{1-x}$, wherein x satisfies the formula of $0.05 < x < 0.3$. The compound semiconductor is a vapor phase epitaxial growth film formed by a method such as the Molecular Beam Epitaxy.

A compound semiconductor device, comprises a substrate composed of indium antimonide (InSb), a first conductive layer deposited on the substrate and composed of tin-indium antimonide expressed by the chemical formula $Sn_x(InSb)_{1-x}$, where $0.05 \leq x \leq 0.3$, a second conductive layer that is a semiconductor device region (active region) formed on the first conductive layer, an electrode provided on the second conductive layer, and a surface protective film formed on the first conductive layer except for the electrode portion.

A fabrication method of a compound semiconductor device comprises the steps of vapor-growing a tin-indium antimonide layer having a composition represented by chemical formula $Sn_x(InSb)_{1-x}$ on a substrate composed of indium antimonide (InSb) at a substrate temperature of 50° to 230° C., where $0.05 \leq x \leq 0.3$, and forming a semiconductor device region (active region) on the tin-indium antimonide layer.

In other words, according to the present invention, since In group III, Sn in IV group, and Sb in group V, which have large bonding strength are selected as composition elements, crystal growth is improved. In addition, the composition ratio of tin (Sn) in a III–IV–V group compound semiconductor is selected so that the energy gap can be set in the range from 0 to 0.17 eV. Thus, the compound semiconductor device can detect infrared rays of 10 μm band.

In the fabrication method according to the present invention, when a tin-indium antimonide ($Sn_x(InSb)_{1-x}$) layer is vapor-grown on a substrate composed of indium antimonide (InSb), the temperature of the substrate should be set in the range from 50° to 230° C. Experimental results show that a required single crystal cannot be grown and thereby a compound semiconductor device with required characteristics and performance cannot be formed unless the abovementioned temperature range is satisfied.

FIG. 12 shows a phase diagram of $Sn_x(InSb)_{1-x}$. It was clear from this FIG. 12 that when a crystal growth was conducted at a temperature of more than 232° C., Sn and InSb were separated. Thus, mixed crystals thereof could not be formed. On the other hand, it was found from inventor's extensive experiments that the crystal growth was possible at a temperature of not more than 232° C., and mixed crystals of $Sn_x(InSb)_{1-x}$ could be formed by gas-solid phase reaction using Molecular Beam Epitaxy method and the likes. Further, at a temperature of less than 50° C. it was found that the crystal growth on the substrate could not be formed.

In the compound semiconductor device according to the present invention, a substrate is composed of indium antimonide with a lattice constant of 6.4787 Å. A vapor-grown tin-indium antimonide ($Sn_x(InSb)_{1-x}$) layer is vapor-grown on the substrate at a predetermined substrate temperature. A semiconductor device region (active region) is formed on the tin-indium antimonide layer.

FIG. 13 shows a relation between the band gap and the lattice constant in the $Sn_x(InSb)_{1-x}$ and $Cd_xHg_{1-x}Te$ compounds. It was found from this FIG. 13 that the range of x required for the compound semiconductor $Sn_x(InSb)_{1-x}$ of the present invention was determined. That is, the band gap of Sn is −0.4 eV and that of InSb is 0.17 eV. Accordingly, when x exceeds 0.35, $Sn_x(InSb)_{1-x}$ becomes from a semiconductor to a semimetal which does not required in the present invention. As a material for detecting the infrared of 10 μm band, x is desired in the range of 0.05 to 0.3. Further, the lattice constant of $Sn_x(InSb)_{1-x}$ hardly varies with the amount of x. Accordingly, the mismatching (Δa/a) with the substrate is only 0.16%.

On the other hand, since the lattice constant of $Cd_xHg_{1-x}Te$ varies with the amount of x, the mismatching (Δa/a) with the substrate increases to −1.2%.

In other words, the lattice constant of tin vapor-grown on the substrate is 6.4789 Å. Thus, the mismatching (Δa/a) of tin against the substrate is as small as 0.16%. In addition, the bonding strength among the composition elements is large and thereby a required single crystal can be stably grown. Thus, a vapor growth layer with small detects is formed.

By selecting the composition ratio of the composition elements, a desired narrow energy gap of the vapor growth layer of the tin-indium antimonide layer can be accomplished. In the compound semiconductor device, since the indium antimonide of the substrate absorbs rays of visible light to infrared rays with a wavelength of around 5 μm, only infrared rays with wavelengths of 5 μm or more enter the tin-indium antimonide layer. In the tin-indium antimonide layer, the infrared rays become carriers due to photoelectric effect. Thus, the carriers can be easily obtained as electric signals from electrodes. Consequently, infrared rays with a 10 μm band can be effectively and accurately detected. In addition, the defects as EPD (Etch Pit Density) in the epitaxial growth layer are as small as $10^2$ to $10^4$ cm$^{-2}$. Moreover, the fixed electric charges in the protective film are in the range of $\pm 10^{11}$ cm$^{-2}$. Thus, characteristic variation due to temperature rise can be remarkably restricted. Consequently, the functional stability of the compound semiconductor device can be improved. Furthermore, the composition elements (In, Sn, and Sb) are non-toxic or less toxic. Thus, the compound semiconductor device according to the present invention can be safely handled.

These and other objects, features and advantages of the present invention will become more apparent in light of the following detailed description of best mode embodiments thereof, as illustrated in the accompanying drawings.

DESCRIPTION OF THE PREFERRED EMBODIMENTS

Figure 1:
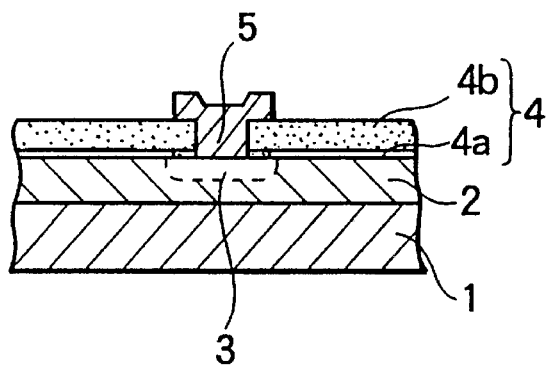
FIG. 1 is a sectional view showing a construction of principal portions of a compound semiconductor device according to the present invention.

Next, with reference to FIG. 1, a compound semiconductor device according to an embodiment of the present invention will be descried. In addition, with reference to FIGS. 2 to 11, a fabrication method of the compound semiconductor device of the present invention will be described.

In FIG. 1, reference numeral 1 is a substrate composed of indium antimonide. Reference numeral 2 is a tin-indium antimonide ($Sn_x(InSb)_{1-x}$) layer that is epitaxially grown on the substrate 1 and forms a first conductive layer. Reference numeral 3 is a second conductive region for forming a semiconductor device region (active region) on the tin-indium antimonide ($Sn_x(InSb)_{1-x}$) layer 2. Reference numeral 4a is an anode oxide layer for forming a first layer of a surface protective film 4. Reference numeral 4b is an oxide layer (for example SiO$_2$ layer) for forming a second layer of the surface protective film 4. Reference numeral 5 is an electrode layer, for example, composed of two layers of for example a chrome layer and a gold layer.

Since the above-described compound semiconductor device has a narrow band gap, it can effectively detect infrared rays of 10 μm band. In other words, in the compound semiconductor device, indium antimonide of the substrate absorbs rays of visible light to infrared rays with a wavelength of around 5 μm. Thus, only infrared rays with wavelengths of 5 μm or more enter the tin-indium antimonide layer. Infrared rays of 10 μm band which enter the tin-indium antimonide layer become carriers due to photon effect in the tin-indium antimonide layer. Since the carriers can easily be obtained as electric signals from electrodes, infrared rays of 10 μm band can be effectively detected. When the cutoff wavelength is 10 μm, the zero bias resistor area value is 100 Ωcm$^2$ (in Ro·A)

Next, the fabrication method of the above-described compound semiconductor device will be described.

Figure 2:
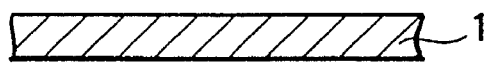
FIG. 2 is a sectional view showing an indium antimonide wafer in a step of a fabrication method of a compound semiconductor device according to the present invention.
Figure 3:
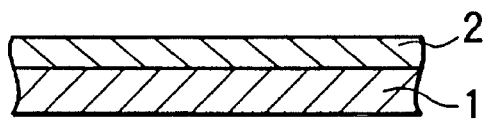
FIG. 3 is a sectional view showing an epitaxial growth layer in a step of the fabrication method of the compound semiconductor device according to the present invention.
Figure 4:
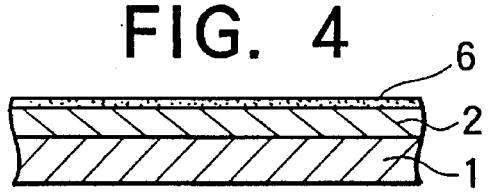
FIG. 4 is a sectional view where an SiO$_2$ film is deposited on the epitaxial growth layer in a step of the fabrication method of the compound semiconductor device according to the present invention.
Figure 5:
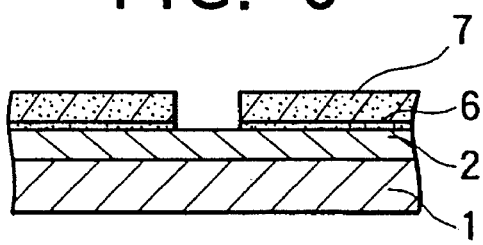
FIG. 5 is a sectional view where an SiO$_2$ film is patterned as a mask on the epitaxial growth layer in a step of the fabrication method of the compound semiconductor device according to the present invention.
Figure 6:
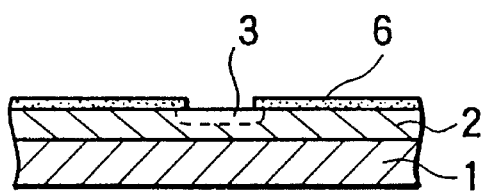
FIG. 6 is a sectional view showing a second conductive region where impurities are selectively diffused in the epitaxial growth layer through the mask pattern in a step of the fabrication method of the compound semiconductor device according to the present invention.

A square-shaped wafer (substrate) 1 of indium antimonide shown in FIG. 2 is prepared. As shown in FIG. 3, tin-indium antimonide layer 2 with a thickness of around 10 μm that is a first conductive layer is deposited on a main surface of the substrate 1 by vapor growth method. The vapor growth method is for example MBE (Molecular Beam Epitaxy) method. In the vapor growth method, the temperature of the substrate 1 is 120° C. The composition ratio x of the tin-indium antimonide layer ($Sn_x(InSb)_{1-x}$) 2 is set to be in the range of 0.05 to 0.3. The content of tellurium (Te) added to the first conductive layer is set so that the carrier concentration becomes 0.5 to $1.5 \times 10^{15}$ cm$^{-3}$. As shown in FIG. 4, a silicon dioxide (SiO$_2$) 6 film with a thickness of around 300 nm is deposited on the tin-indium antimonide layer 2 (epitaxial growth layer) by, for example, CVD (Chemical Vapor Deposition) method. Thereafter, a resist layer 7 is deposited on the surface of the silicon dioxide film 6. PED (Photo Etching Process) is performed for the resist layer 7. As shown in FIG. 5, a pattern is masked on the resist layer 7. The silicon dioxide film 6 is selectively etched out with a hydrofluoric acid agent so as to form a hole. Thereafter, as shown in FIG. 6, the pattern of the resist layer 7 is removed. To form a second conductive region 3, the pattern of the silicon dioxide film 6, which is an impurity diffusing mask, is exposed.

A predetermined region of the tin-indium antimonide layer 2 is selectively exposed. Predetermined impurities (for example, cadmium (Cd)) are selectively diffused in the tin-indium antimonide layer 2 so that the carrier concentration thereof become in the range of 0.5 to $1.5 \times 10^{16}$ cm$^{-3}$ by, for example, vapor diffusing method. Thus, a second conductive region 3 is formed, thereby activating the predetermined region. In reality, the substrate 1 with the masked epitaxial growth layer 2 and 100 mg of cadmium as an impurity source are placed in an vacuum vessel and heated at 200° C. for several ten hours. Thus, the impurities of cadmium (Cd) are diffused and thereby a second conductive region 3 is formed.

Figure 7:
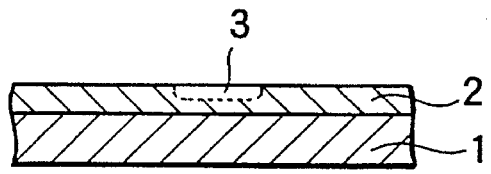
FIG. 7 is a sectional view where the mask pattern is removed from the second conductive region in a step of the fabrication method of the compound semiconductor device according to the present invention.
Figure 8:
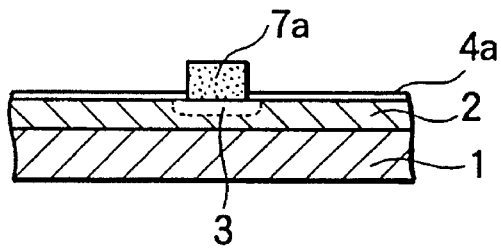
FIG. 8 is a sectional view where a mask pattern is deposited on the second conductive region and a first protective film is selectively deposited thereon in a step of the fabrication method of the compound semiconductor device according to the present invention.

The silicon dioxide film 6, which is the impurity diffusing mask, is selectively etched out with the hydrofluoric acid agent. As shown in FIG. 7, the epitaxial growth layer 2 having the second conductive region 3 is exposed. Thereafter, a resist mask 7a is selectively formed on the second conductive region 3. As shown in FIG. 8, an anodic oxide film 4a is formed on the exposed surface. The anodic oxide film 4a is formed by electrolytic process. For example, a platinum (Pt) plate is used as an opposed electrode. A 0.1 normal solution of potassium hydroxide is used as an electrolytic solution. The electrolytic process is performed with a current density of 1 mA/cm$^2$ for around 15 minutes.

Figure 9:
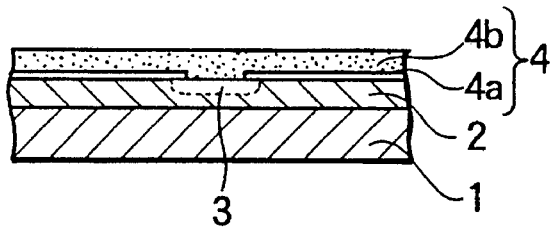
FIG. 9 is a sectional view where the mask pattern is removed and a second protective film is deposited on the entire surface including the first protective film in a step of the fabrication method of the compound semiconductor device according to the present invention.
Figure 10:
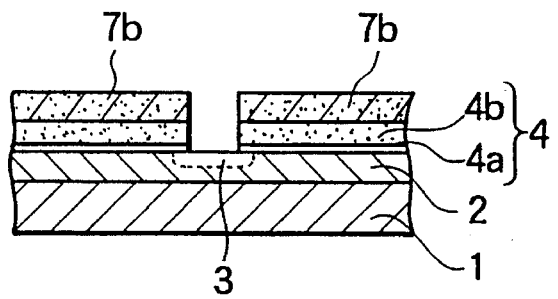
FIG. 10 is a sectional view where a mask pattern is deposited and the second protective film is selectively etched out in a step of the fabrication method of the compound semiconductor device according to the present invention.

After the anodic oxidation process is performed, the resist mask 7a is removed to expose the surface of the epitaxial growth layer 2. Thereafter, as shown in FIG. 9, a silicon dioxide film 4b is deposited on the surface of the anodic oxide film 4a and the exposed surface of the epitaxial growth layer 2 by, for example, the CVD method. Thus, a dual-layered protective film 4 is formed. Thereafter, a resist mask 7b is deposited on the silicon dioxide film 4b by the PEP method. The silicon dioxide film 4b is selectively etched out by the hydrofluoric acid agent. As shown in FIG. 10, the active region is exposed.

Figure 11:
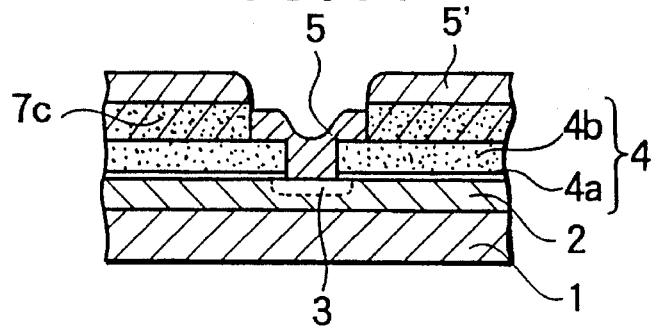
FIG. 11 is a sectional view where a metal layer including electrodes is vapor deposited with a mask pattern of the second protective film selectively etched out in a step of the fabrication method of the compound semiconductor device according to the present invention.
Figure 12:
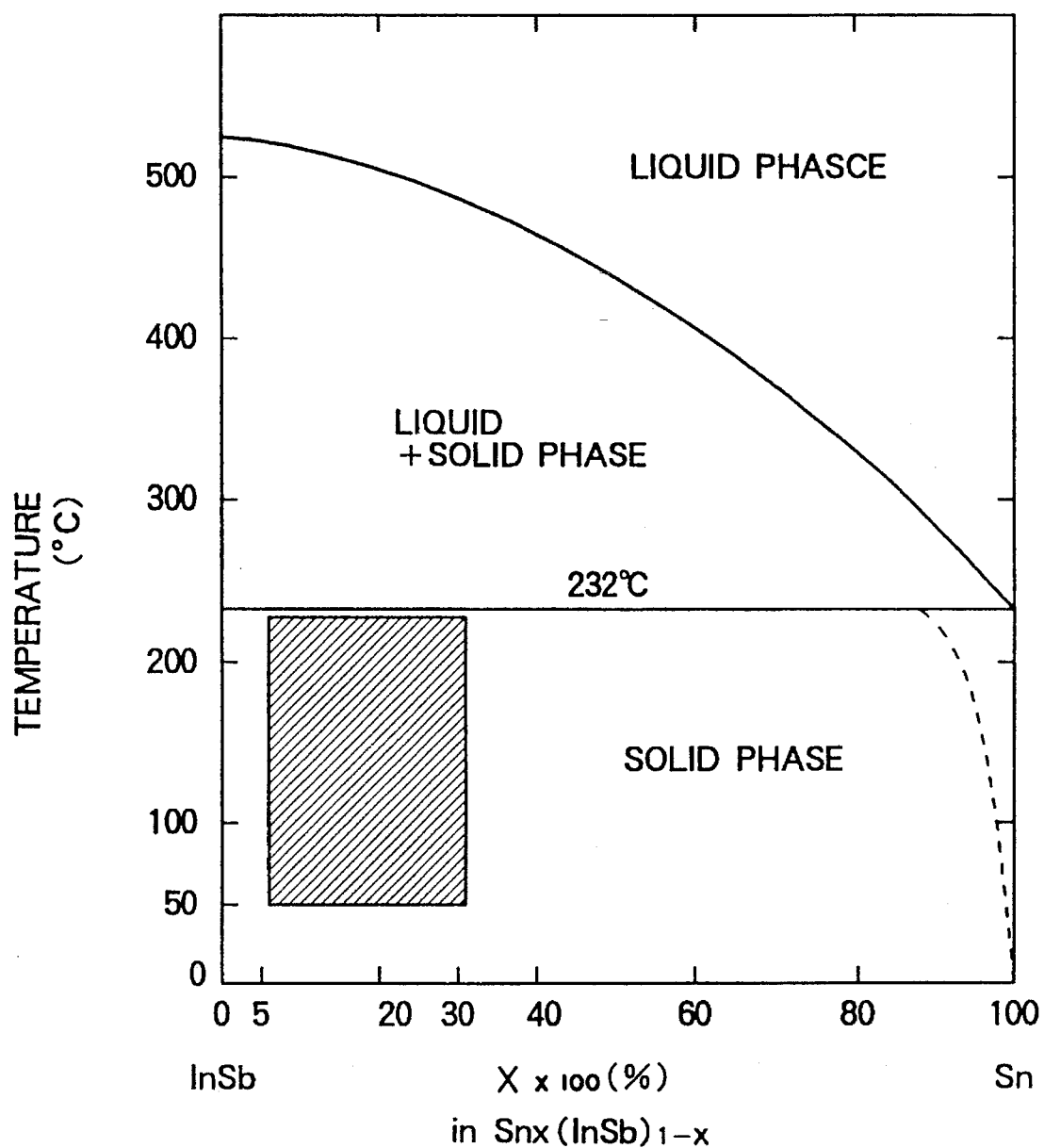
FIG. 12 shows a phase diagram of the compound semiconductor of the present invention.
Figure 13:
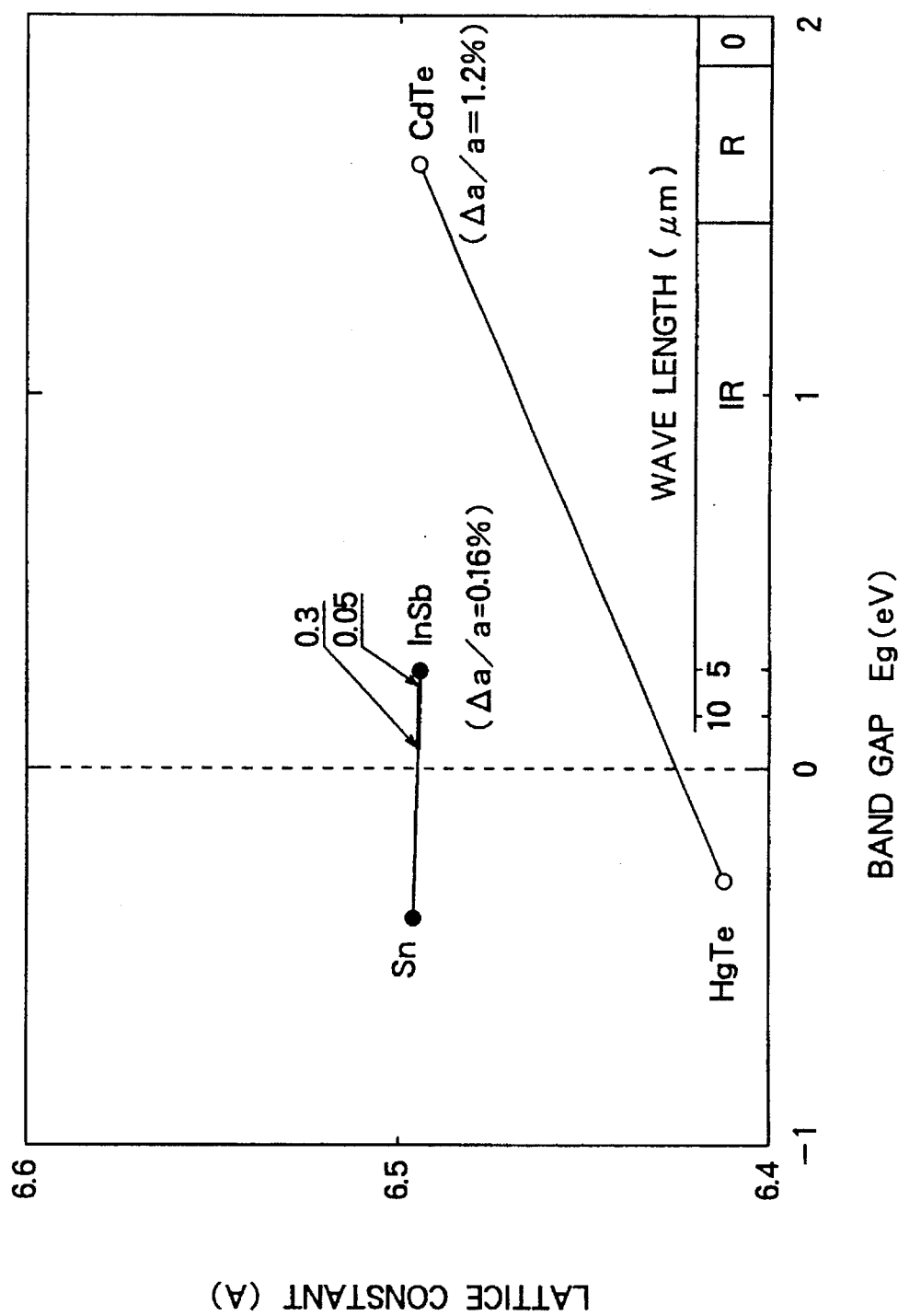
FIG. 13 shows a relation between the band gap and the lattice constant of the compound semiconductor of the present invention.

Thereafter, the resist mask 7b is temporarily removed. The silicon dioxide film 4b having the hole is exposed. A resist mask 7c is deposited on the exposed surface by the PEP method. As shown in FIG. 11, a metal layer forming an electrode 5 is vapor-deposited. The metal layer vapor-deposited has a two layered structure which is composed of chrome (Cr) layer with a thickness of for example 20 nm and a gold (Au) layer with a thickness of 500 nm. After the vapor deposition process is completed, the resist mask 7c is removed. At the same time, an excessively vapor-deposited metal layer 5 formed on the resist mask 7c is peeled off. Thus, the compound semiconductor device as shown in FIG. 1 can be obtained with high yield.

In the above-described embodiment, the vapor growth of the tin-indium antimonide layer 2 is performed by the MBE method. However, for example MOCVD (Metal Organic Chemical Vapor Deposition) method or the like may be used. In addition, the impurity diffusing process for forming the second conductive region 3 may be performed by another method such as ion injection method or solid phase diffusing method instead of the vapor growth method. Moreover, the protective film 4 may be a single layer film composed of for example aluminum oxide (Al$_2$O$_3$), silicon nitride (Si$_3$N$_4$), or the like instead of the dual-layer film.

In the embodiment, the substrate is composed of indium antimonide. However, without forming the epitaxial growth region on the entire surface of the substrate, indium antimonide (substrate) may be partially exposed. The exposed region may be used as the active region. In other words, predetermined active regions may be formed in the epitaxial growth layer and the indium antimonide (substrate) so as to selectively detect infrared rays with many wavelengths (in a wide wavelength region).

As described above, according to the compound semiconductor device of the present invention, a main active (device) region is formed in a vapor growth layer of tin-indium antimonide, which has higher quality than a vapor growth layer composed of mercury cadmium telluride. In addition, the compound semiconductor device of the present invention has excellent thermal and chemical stability. Since the narrow band gap, which is a main feature of the compound semiconductor, is effectively used, infrared rays of 10 μm band can be precisely detected. Moreover, the compound semiconductor device of the present invention can be fabricated with high yield.

Although the present invention has been shown and described with respect to best mode embodiments thereof, it should be understood by those skilled in the art that the foregoing and various other changes, omissions, and additions in the form and detail thereof may be made therein without departing from the spirit and scope of the present invention.

What is claimed is:

1. A compound semiconductor device, comprising:

a substrate composed of indium antimonide (InSb);

a first conductive layer deposited on said substrate and composed of tin-indium antimonide having a composition represented by the chemical formula Sn$_x$(InSb)$_{1-x}$, where $0.05 \leq x \leq 0.3$;

a second conductive region that is a semiconductor device region (active region) formed in said first conductive layer;

an electrode provided on said second conductive layer; and a surface protective film deposited on said first conductive layer except for said electrode portion.

2. The compound semiconductor device as set forth in claim 1, wherein said first conductive layer contains Te as a source of conductor impurities.

3. The compound semiconductor device as set forth in claim 2, wherein the carrier concentration of Te is in the range from $0.5 \times 10^{15}$ cm$^{-3}$ to $1.5 \times 10^{15}$ cm$^{-3}$.

4. The compound semiconductor device as set forth in claim 1, wherein said second conductive layer contains Cd as a source of conductor impurities.

5. The compound semiconductor device as set forth in claim 4, wherein the carrier concentration of Cd is in the range of from $0.5 \times 10^{16}$ cm$^{-3}$ to $1.5 \times 10^{16}$ cm$^{-3}$.

6. The compound semiconductor device as set forth in claim 1, wherein said first conductive layer detects infrared rays of 10 μm or higher.

7. The compound semiconductor device as set forth in claim 1,
   wherein said surface protective film is formed of two layers that are an anodic oxide film and a silicon dioxide film formed thereon.

8. A compound semiconductor that is composed of tin-indium antimonide having a composition represented by the chemical formula $Sn_x(InSb)_{1-x}$, where $0.05 \leq x \leq 0.3$,
   wherein said compound semiconductor further contains Te as a source of conductor impurities.

* * * * *